(12) United States Patent  (10) Patent No.: US 11,231,376 B2
Chen et al. (45) Date of Patent: Jan. 25, 2022

(54) METHOD FOR SEMICONDUCTOR WAFER INSPECTION AND SYSTEM THEREOF

(71) Applicant: TAIWAN SEMICONDUCTOR MANUFACTURING COMPANY LTD., Hsinchu (TW)

(72) Inventors: Chien-Huei Chen, Kaohsiung (TW); Hung-Yi Chung, Taoyuan (TW); Xiaomeng Chen, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/849,981

(22) Filed: Apr. 15, 2020

(65) Prior Publication Data

US 2021/0063319 A1 Mar. 4, 2021

Related U.S. Application Data

(60) Provisional application No. 62/893,665, filed on Aug. 29, 2019.

(51) Int. Cl.
*G01N 21/95* (2006.01)
*G01N 21/956* (2006.01)
(Continued)

(52) U.S. Cl.
CPC ..... *G01N 21/9505* (2013.01); *G01N 21/8851* (2013.01); *G01N 21/956* (2013.01);
(Continued)

(58) Field of Classification Search
CPC .......... G01N 21/9505; G01N 21/8851; G01N 21/956; G01N 2021/8864; G06T 7/0004; G06T 2207/30148
See application file for complete search history.

(56) References Cited

U.S. PATENT DOCUMENTS 9,347,862 B2 5/2016 Lynch
2005/0075585 A1* 4/2005 Kim ................... A61C 19/045
600/590

(Continued)

FOREIGN PATENT DOCUMENTS

TW 201824421 A 7/2018
TW 201827812 A 8/2018

OTHER PUBLICATIONS

Non-Final Office Action of the TW family application TW109128275 dated Nov. 17, 2020.
(Continued)

*Primary Examiner* — Jamil Ahmed
(74) *Attorney, Agent, or Firm* — WPAT, P.C., Intellectual Property Attorneys; Anthony King

(57) ABSTRACT

A method for semiconductor wafer inspection is provided. The method includes the following operations. The semiconductor wafer is scanned to acquire a scanned map, wherein the semiconductor wafer is patterned according to a design map having a programmed defect. The design map and the scanned map are transformed to a transformed inspection map according to the location of the programmed defect on the design map and the location of the programmed defect on the scanned map. The system of semiconductor wafer inspection is also provided.

20 Claims, 11 Drawing Sheets

(51) Int. Cl.
 *G01N 21/88* (2006.01)
 *G06T 7/00* (2017.01)
(52) U.S. Cl.
 CPC .... *G06T 7/0004* (2013.01); *G01N 2021/8864* (2013.01); *G06T 2207/30148* (2013.01)

(56) References Cited

U.S. PATENT DOCUMENTS

2018/0113387 A1* 4/2018 Xiao .................. G03F 7/70633
2018/0268099 A1* 9/2018 Katzir ................. G06F 30/398

OTHER PUBLICATIONS

English Abstract Translation of the Taiwan Office Action issued by Taiwan Intellectual Property Office.

* cited by examiner

METHOD FOR SEMICONDUCTOR WAFER INSPECTION AND SYSTEM THEREOF

CROSS REFERENCE TO RELATED APPLICATION

This application claims the benefit of prior-filed U.S. provisional application No. 62/893,665, filed on Aug. 29, 2019.

FIELD

The present disclosure is related to a method for semiconductor wafer inspection and system thereof, more particularly, to a system and a method that using programmed defects to align design layouts and scanned images before normal defect inspection.

BACKGROUND

Manufacturing semiconductor devices such as logic and memory devices typically includes processing a substrate such as a semiconductor wafer using a large number of semiconductor manufacturing processes to form various features and multiple levels of the semiconductor devices. For example, lithography is a semiconductor manufacturing process that involves transferring a pattern from a reticle to a resist arranged on a semiconductor wafer. In some other examples, the manufacturing processes may include the operations such as chemical-mechanical polishing (CMP), etching, deposition, and ion implantation. Multiple semiconductor devices may be manufactured in an arrangement on a single semiconductor wafer and then separated into individual semiconductor devices.

Inspection processes are used at various steps during a semiconductor manufacturing process to detect defects on wafers to promote higher yield in the manufacturing process. Inspection has been an important part of fabricating semiconductor devices such as ICs. However, as the dimensions of semiconductor devices decrease, inspection becomes even more important to the successful manufacture of acceptable semiconductor devices because smaller defects can cause the devices to fail.

BRIEF DESCRIPTION OF THE DRAWINGS

Aspects of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
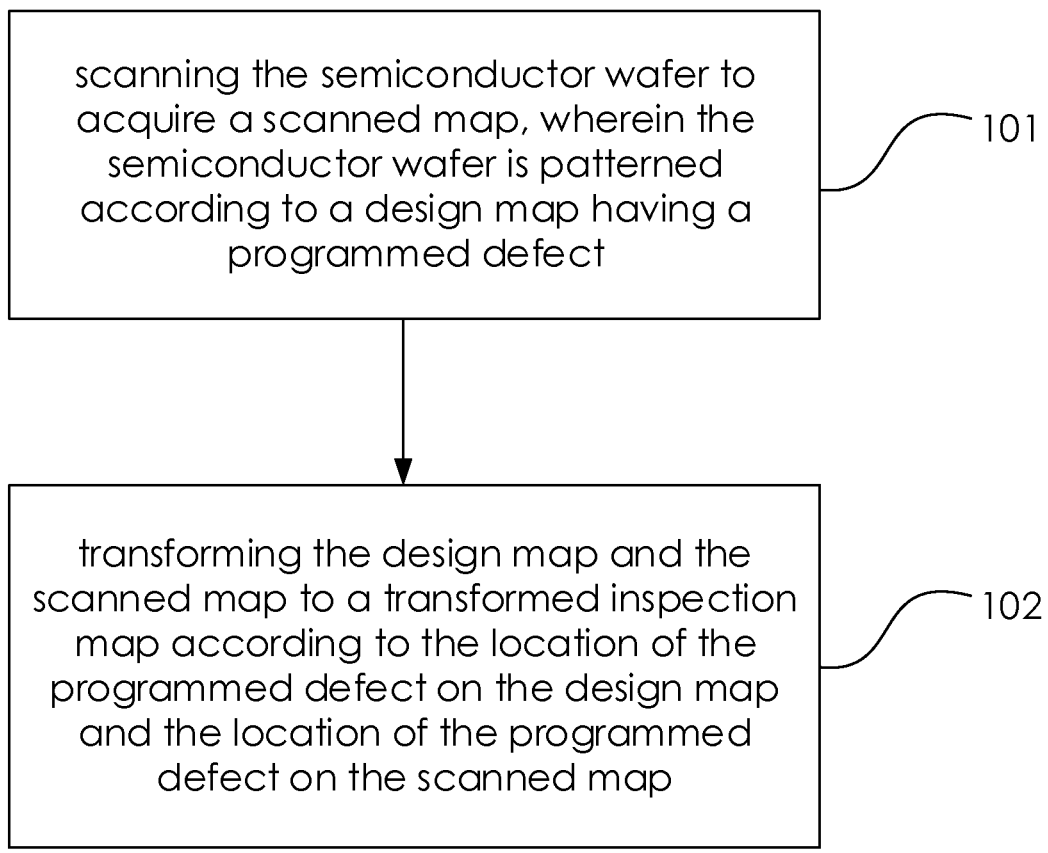
FIG. 1 illustrates a flow chart of method for semiconductor wafer inspection according to some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer or section from another. The terms such as "first", "second", and "third" when used herein do not imply a sequence or order unless clearly indicated by the context.

A hot spot is a device pattern which has relatively large critical dimension and patterning feature errors with respect to the targets on wafers. In order to increase the process yield, hot spot inspection is developed to locate specific local patterns on the cell or die surface that exhibit excessive manufacturing abnormally. Generally, hot spot inspection is accomplished by applying extra high sensitivity detection on the very local image area corresponding to the hot spots in the layout of the wafer. Therefore, the intended inspection areas of the hot spots must be accurately placed on the acquired images during wafer scanning.

Some of inspection tools accomplish the scanning operation by using a patch design alignment (PDA) method which firstly renders a layer of the design layout image to synthetic images, then aligns the rendered synthetic images to scanned images. However, this patch design alignment method has many challenges, for instance, it needs considerable computing power to render a synthetic images based on the design layout because a complex image processing operation depending on tens of parameters has to be taken place. For instance, in using such patch design alignment method in a process of recipe inspection, one user firstly selects layers of a design to be rendered, then a system searches through parameter space for the optimal rendering parameters that may yield the best matched images. Such complex and time consuming operations have to be repeated for each scanning test of recipe inspection.

Also, when the process is varied, the scanned images are likely to change so that the previously optimized rendered synthetic images may no longer match the scanned images. For instance, in some circumstances, although the design layout of the semiconductor wafer is the same, the subsequent semiconductor wafer may have a different thickness compared to the previous one, and such alignment method may be not reliable since the optical images of the semiconductor wafers may be distinct.

Accordingly, the present disclosure provides a system and a method for optical inspection tools to automatically and accurately register design images to scanned images by utilizing programmed defects (PDs) during image registration or alignment.

FIG. 1 illustrates a flow chart of inspecting a semiconductor wafer according to some embodiments of the present disclosure. In some embodiments, the inspection includes an operation 101: scanning the semiconductor wafer to acquire a scanned map, wherein the semiconductor wafer is patterned according to a design map having a programmed defect; and an operation 102: transforming the design map and the scanned map to a transformed inspection map according to the location of the programmed defect on the design map and the location of the programmed defect on the scanned map.

Figure 2A:
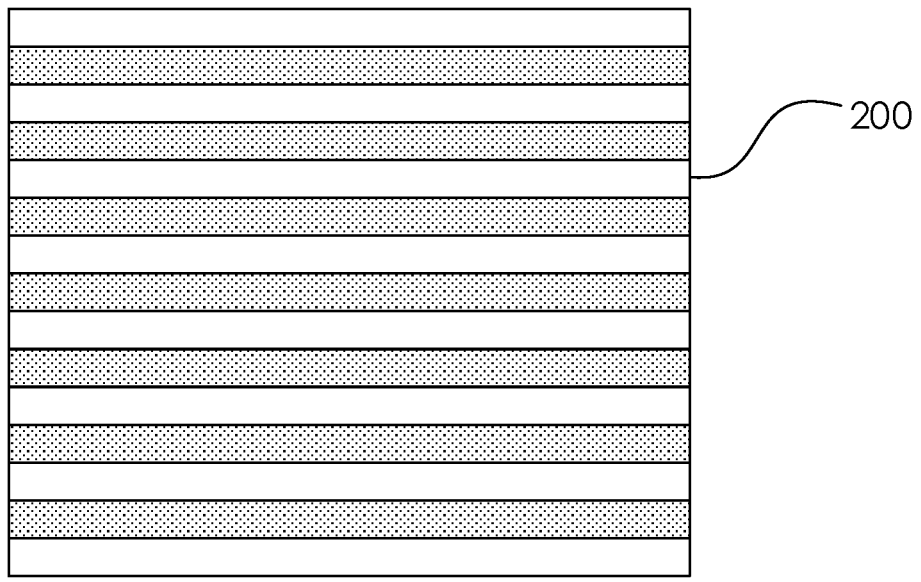
FIG. 2A illustrates a top view of a design map according to some embodiments of the present disclosure.
Figure 2B:
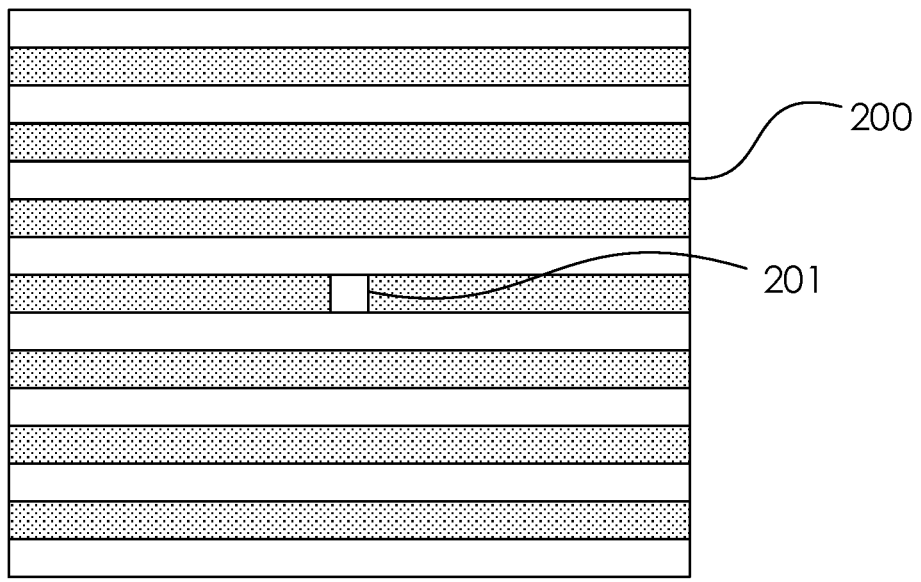
FIG. 2B illustrates a top view of a design map according to some embodiments of the present disclosure.
Figure 2C:
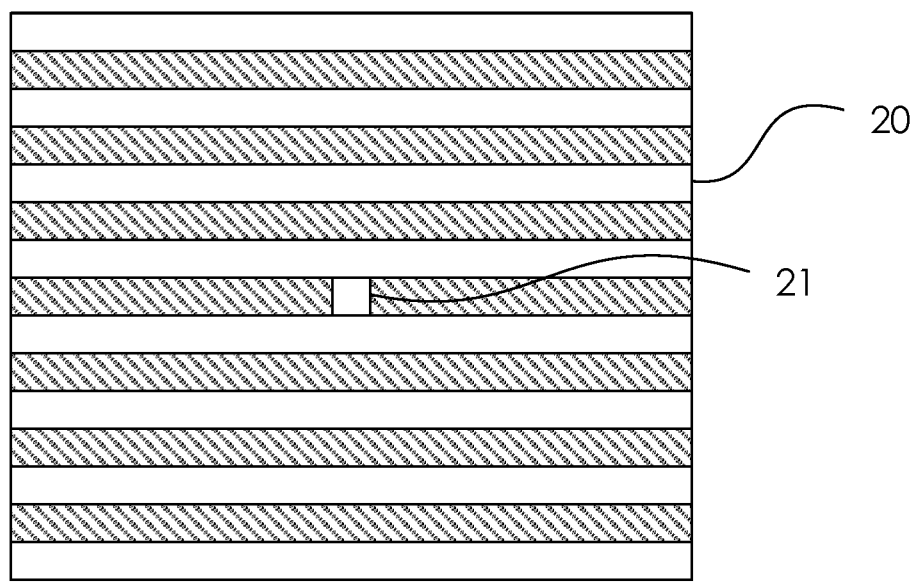
FIG. 2C illustrates a top view of a mask layer according to some embodiments of the present disclosure.

In performing the operation 101, the programmed defect is designed to be formed on the semiconductor wafer. Generally, the programmed defects are defects that defined as a particular pattern, which is not particles or other foreign material, and may be observed using suitable inspection tool on the wafer. For example, the programmed defects are intentionally embedded into the design of the semiconductor wafer, for instance, deliberately created by adding or removing a portion of patterns on the design map. Such programmed defects are transferred to the semiconductor wafer by a mask including such programmed defect pattern. As shown in FIG. 2A, which shows the design map 200 without programmed defects, the layout of the semiconductor wafer appears to possess a plurality of stripes. In contrast, as shown in FIGS. 2B and 2C, which show the design map 200 with a programmed defect 201 and a mask layer 20 formed according to the design map 200 with a programmed defect 201, respectively. An opening 21 on the mask layer 20 is formed according to the programmed defect 201 of the design map 200. By a photolithography operation, the programmed defect 201 may be transferred to the semiconductor wafer.

Figure 3:
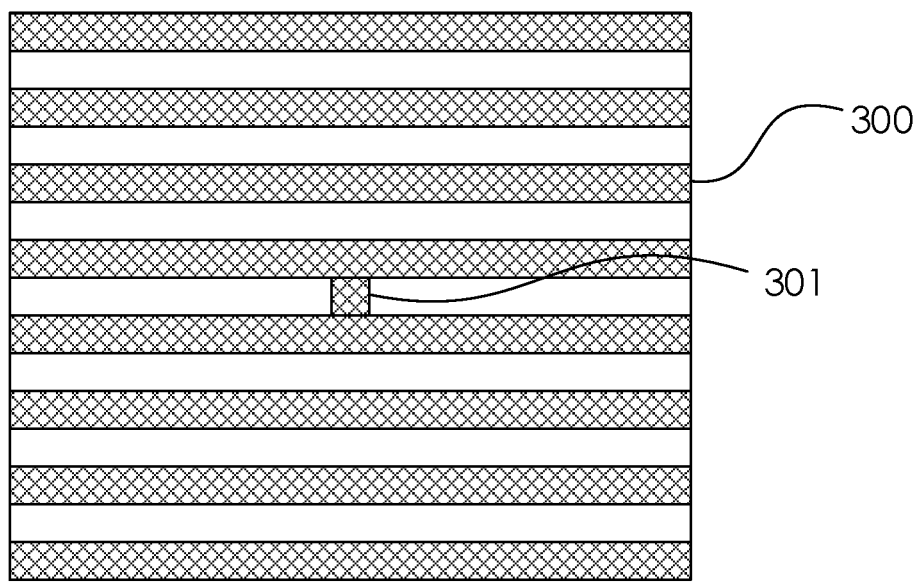
FIG. 3 illustrates a top view of a scanned map according to some embodiments of the present disclosure.

Referring to FIG. 3, which shows a scanned image of a portion of the patterned semiconductor wafer. The semiconductor wafer with programmed defect 301 may be scanned by optical devices such as optical, laser-based, electron-beam or other similar type of inspection tools, and thereby a scanned map 300 is acquired accordingly. In some embodiments, the scanned map 300 may only shows a portion of the semiconductor wafer, for example, a chip region on the semiconductor wafer.

After the scanned map 300 is acquired, the design map 200 and the scanned map 300 may be transformed to a transformed inspection map according to the location of the programmed defect 201 on the design map 200 and the location of the programmed defect 301 on the scanned map 300. In some embodiments, the size, scale and/or the angle of the scanned map and the designed map may be distinct, thereby prior to the transforming operation, a mapping function may be introduced to align the coordinate of the designed map 200 and the coordinate of the scanned map 300. For advanced inspection tool with high precision stage, the mapping function should be a linear function that only involves scaling and shifting. Scaling may be attributed to imperfect pixel size, and shifting may be attributed to imperfect wafer orientation. As a result, the parameters of the linear mapping function can be determined with two anchor points per swath height. However, for inferior inspection tool that exhibit non-linear image distortion, the mapping function may be non-linear. As a result, the parameters of the non-linear mapping function can be determined with more than two anchor points per swath height.

Figure 4A:
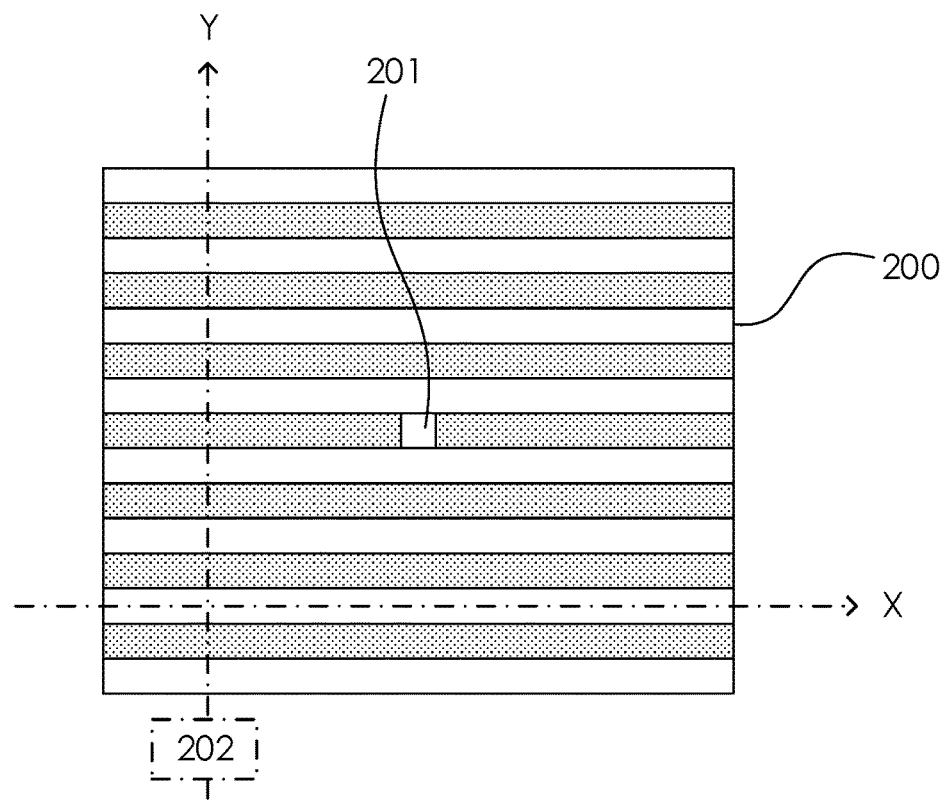
FIG. 4A illustrates a top view of a design map according to some embodiments of the present disclosure.
Figure 4B:
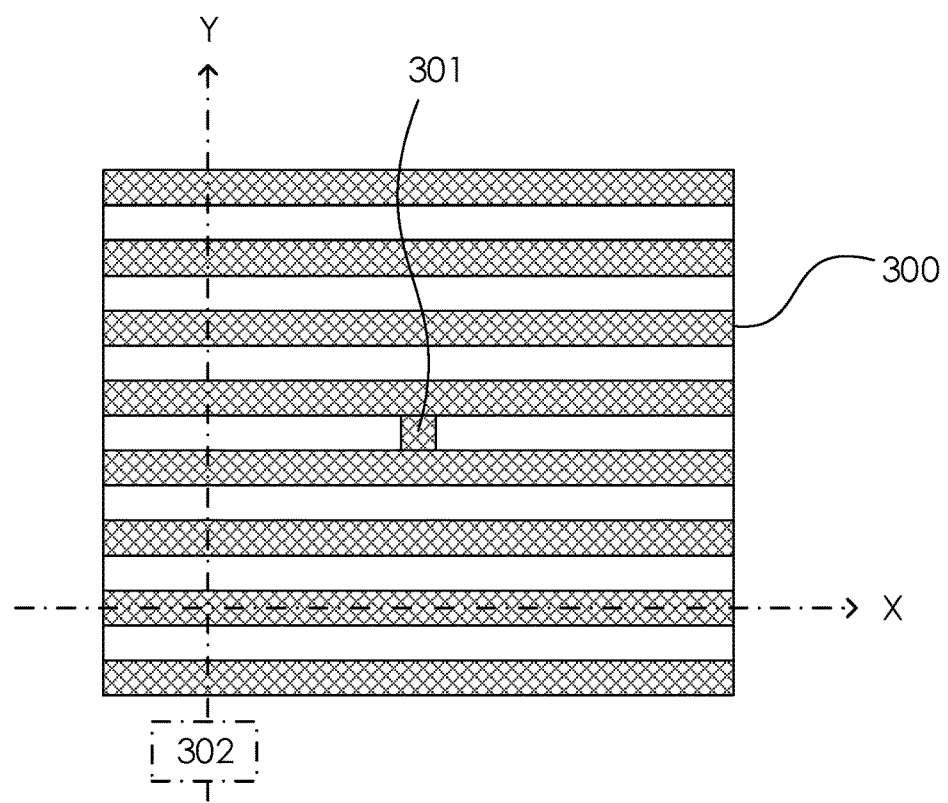
FIG. 4B illustrates a top view of a scanned map according to some embodiments of the present disclosure.

In some embodiments, the mapping function correlates the coordinate of the design map and the coordinate of the scanned map. Referring to FIG. 4A, in some embodiments, the design map 200 may include a first coordinate plane 202, and referring to FIG. 4B, the scanned map 300 may include a second coordinate plane 302. In some embodiments, the first coordinate plane 202 and the second coordinate plane 302 may be correlated with the linear mapping function.

In some embodiments, for an advanced inspection tool with high precision stage, the second coordinate plane 302 may be registered to the first coordinate plane 301 according to the linear mapping function. For example, the second coordinate plane 302 may be aligned to the first coordinate plane 202 by following a mapping function $f(D_x, D_y)=(S_x, S_y)$, wherein $(D_x, D_y)$ is the coordinate of the design map 200 and $(S_x, S_y)$ is the coordinate of the scanned map 300. Moreover, in such example, the mapping function may be a linear function that includes a scaling constant and a shifting constant. In some embodiments, the scaling constant is due to imperfect pixel size, and the shifting constant is due to imperfect wafer orientation.

In some other embodiments, the first coordinate plane 202 may be registered to the second coordinate plane 302 according to the linear mapping function. In such embodiments, the coordinates of the points in the design map 200 (i.e., the programmed defects) may be transformed to new coordinates according to the linear function, and the transformed inspection map formed through the registering of the first coordinate plane 202 and the second coordinate plane 302 may either follow the coordination of the first coordinate plane 202 or the second coordinate plane 302. In some embodiments, both of the first coordinate plane 202 and the second coordinate plane 302 are transformed to an aligned coordinate plane other than the first coordinate plane 202 and the second coordinate plane 302 to form the transformed inspection map by the registration of the transformed coordinate planes.

In some other embodiments, the linear mapping function may be calculated independently for each swath. A swath and its following swaths, for example, may be conducted in a serpentine manner. Each swath covers a swath height which is a defined stripe area on the semiconductor wafer. Alternatively stated, the registration between the design map 200 and the scanned map 300 is done independently for each swath. The scaling constant and the shifting constant of the linear mapping function may be determined with two anchor points per swath height. Accordingly, in some embodiments, there may be two programmed defects per swath height on the design map, and as a result, on the semiconductor wafer.

As previously discussed, the quantity of the programmed defects per swath may be related to the form or the quality of the optical inspection tools. In some embodiments, the optical inspection tools may perform three-dimensional (3D) inspection and provide the scanned map in a three-dimensional image if the optical inspection tools may provide the parameters regarding depths, such as the focus of the optical inspection tool may be adjustable and the microstructure or nanostructure at different depth levels at the vicinity of the surface of the semiconductor wafer may be observed. As a result, the mapping function may be presented as $f(D_x, D_y, D_z)=(S_x, S_y, S_z)$, wherein the z-coordinate is included and at least three programmed defects per swath height are designed on the semiconductor wafer accordingly. In some other embodiments, the scanned map may possess a non-linear image distortion in an inferior optical inspection tools, and therefore it is desirable to create or add more than two programmed defects per swath on the semiconductor wafer to register the design map 200 and the scanned map 300 with such non-linear distortion.

In some embodiments, after registering the design map 200 and the scanned map 300, the locations of the hot spots prior-identified in the design map 200 can be inspected on a transformed inspection map. In some embodiments, the transformed inspection map can be a superposition of the scanned map 300 and the design map 200 after coordinate registration. As a result, the hot spots on the wafer or on a particular chip region of the wafer can be inspected by cursoring the inspection tool to the pre-known locations of the hot spots.

Figure 5:
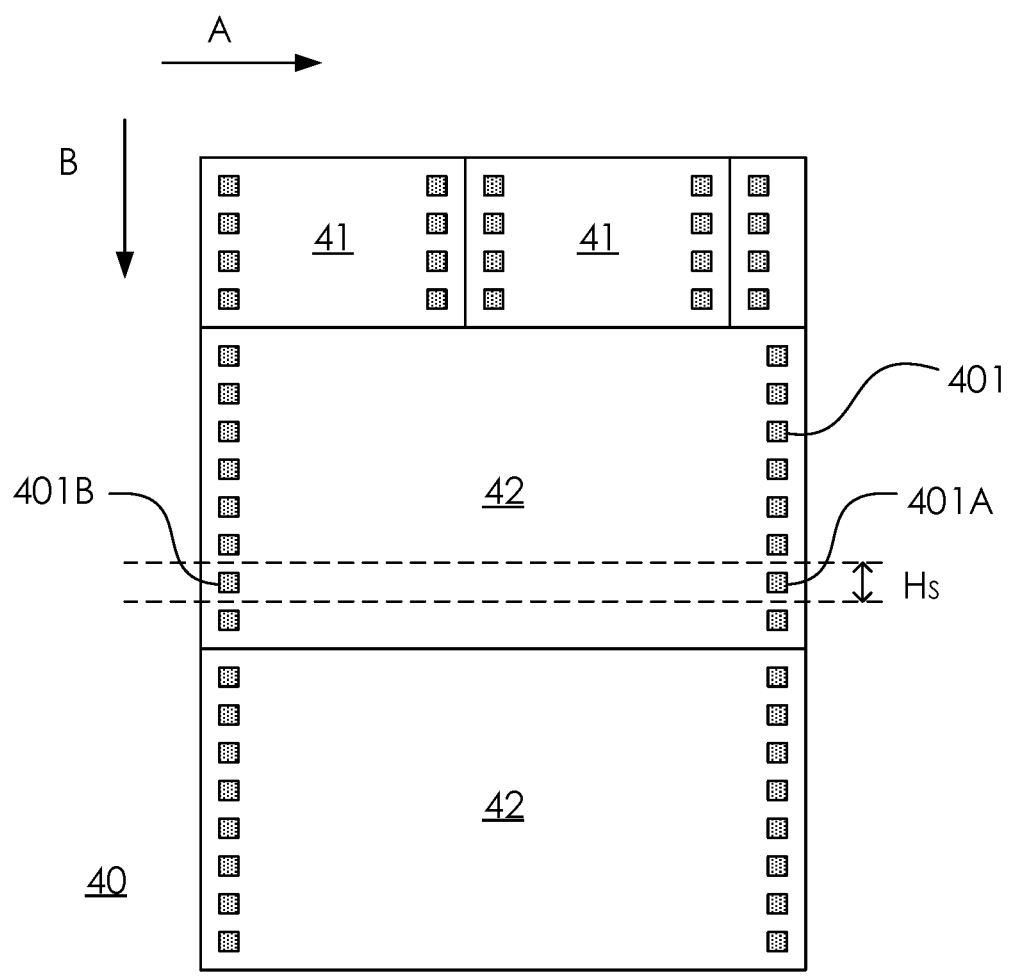
FIG. 5 illustrates a top view of a portion of a semiconductor wafer according to some embodiments of the present disclosure.

Referring to FIG. 5, which is a portion of the semiconductor wafer from a top view perspective. In some embodiments, the semiconductor wafer 40 may include a plurality of chip regions 41, 42. In some embodiments, the size of each of the chip regions 41, 42 may not be identical to others. For instance, the chip regions 41 arranged along with a direction A may have a different size compared to the chip regions 42 arranged along with a direction B. In some embodiments, each of the chip regions 41, 42 may include a side length at least equal to a swath height $H_S$. In some embodiments, the programmed defects 401, which are the physical defects on the chip regions, are designed to form in proximity to two opposite boundaries of each of the chip regions 41, 42. As shown in FIG. 5, in some embodiments, the chip regions 41, 42 may be scanned start from a boundary to another boundary with the swath height $H_S$ in one swath, and therefore at least two programmed defects 401 may be covered per swath when conducting the scanning on a particular chip region 41 or 42 of a semiconductor wafer.

In some embodiments, only several chip regions 41, 42 may have programmed defects and thereby the inspection may be performed on chips of interest instead of the whole die. In some embodiments, for each swath and before the actual defect detection is run, a cell-to-cell (C2C) detection may be performed on local areas in the acquired scanned image where the programmed defects are located.

Figure 6:
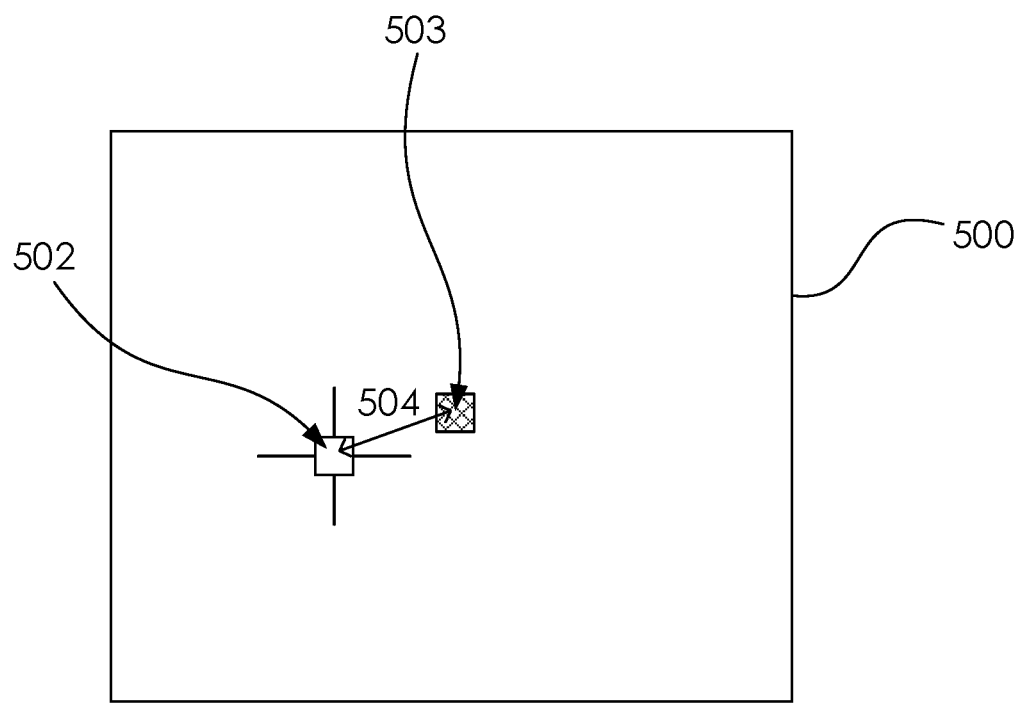
FIG. 6 illustrates a top view of a transformed inspection map according to some embodiments of the present disclosure.

FIG. 6 is a transformed inspection map 500 according to some embodiments of the present disclosure. For the purpose of clarity, only the programmed defect pattern is shown on the transformed inspection map 500. As shown in FIG. 6, the transformed inspection map 500 includes the information regarding the expected location 502 of the programmed defect on the design map and the actual location 503 of the programmed defect on the scanned map, both be presented under the transformed inspection map coordinate based on the linear or non-linear mapping function previously discussed. Accordingly, an offset 504 between the expected location 502 and the actual location 503 of the programmed defect may be ascertained, and in the case of such offset 504 is not zero, in some embodiments, the offset 504 is taken into consideration in the mapping calculation of next swath in order to obtain a more accurate mapping result. Alternatively, the in-situ offset identification can instantaneously feedback the mapping accuracy in previous swath in order to optimize the mapping result in the subsequent swath.

Figure 7:
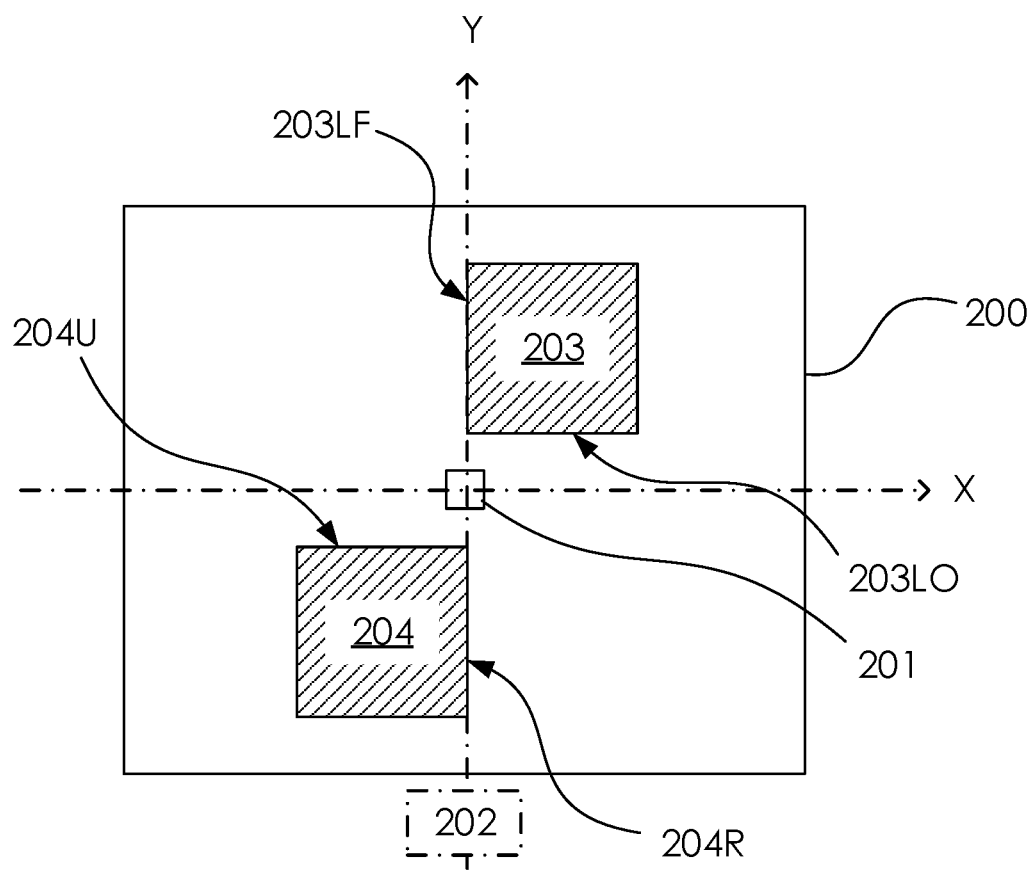
FIG. 7 illustrates a top view of a design map according to some embodiments of the present disclosure.

In some embodiments, the method for semiconductor wafer inspection of the present disclosure further includes an operation of self-monitoring the transforming accuracy by comparing a location of the programmed defect on the transformed inspection map and locations of a pair of care area markers on the transformed inspection map. As shown in FIG. 7, the pair of care area markers 203, 204 may be included in the design map 200, wherein the pair of care area markers 203, 204 are located symmetrically with respect to the expected location of the programmed defect 201. For instance, in some embodiments, the programmed defect 201 is at the origin of the first coordinate plane 202, and a first care area marker 203 is at the first quadrant of the first coordinate plane 202, whereas the second care area marker 204 is at the third quadrant of the first coordinate plane 202. In some embodiments, the first care area marker 203 and the second care area marker 204 are located symmetrically at two sides of the x-coordinate. In some embodiments, the first care area marker 203 and the second care area marker 204 are located symmetrically at two sides of the y-coordinate. In some embodiments, a lower side 203LO of the first care area marker 203, the expected location of the programmed defect 201, and an upper side 204U of the second care area marker 204 are collinear. In some embodiments, a left side 203LF of the first care area marker 203, the expected location of the programmed defect 201, and a right side 204R of the second care area marker 204 are collinear. In some embodiments, the expected location of the programmed defect 201 is between opposing corners of the first care area marker 203 and the second care area marker 204.

Figure 8A:
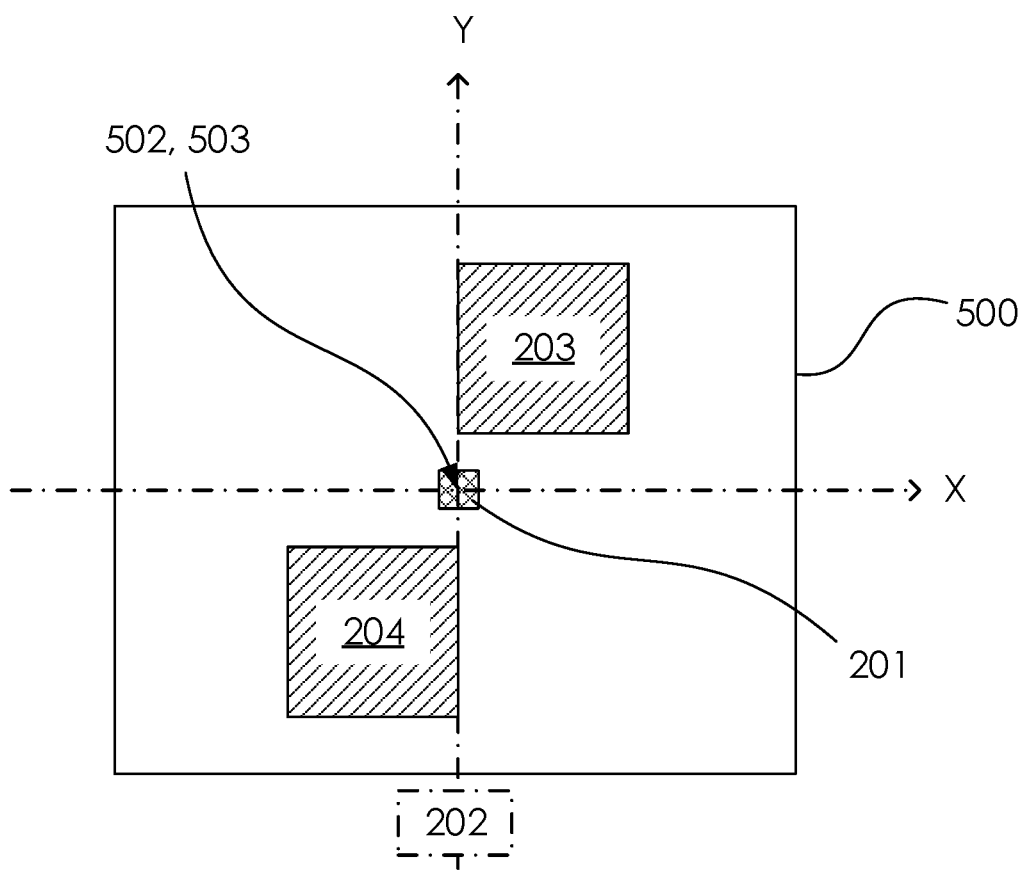
FIG. 8A illustrates a top view of a transformed inspection map according to some embodiments of the present disclosure.
Figure 8B:
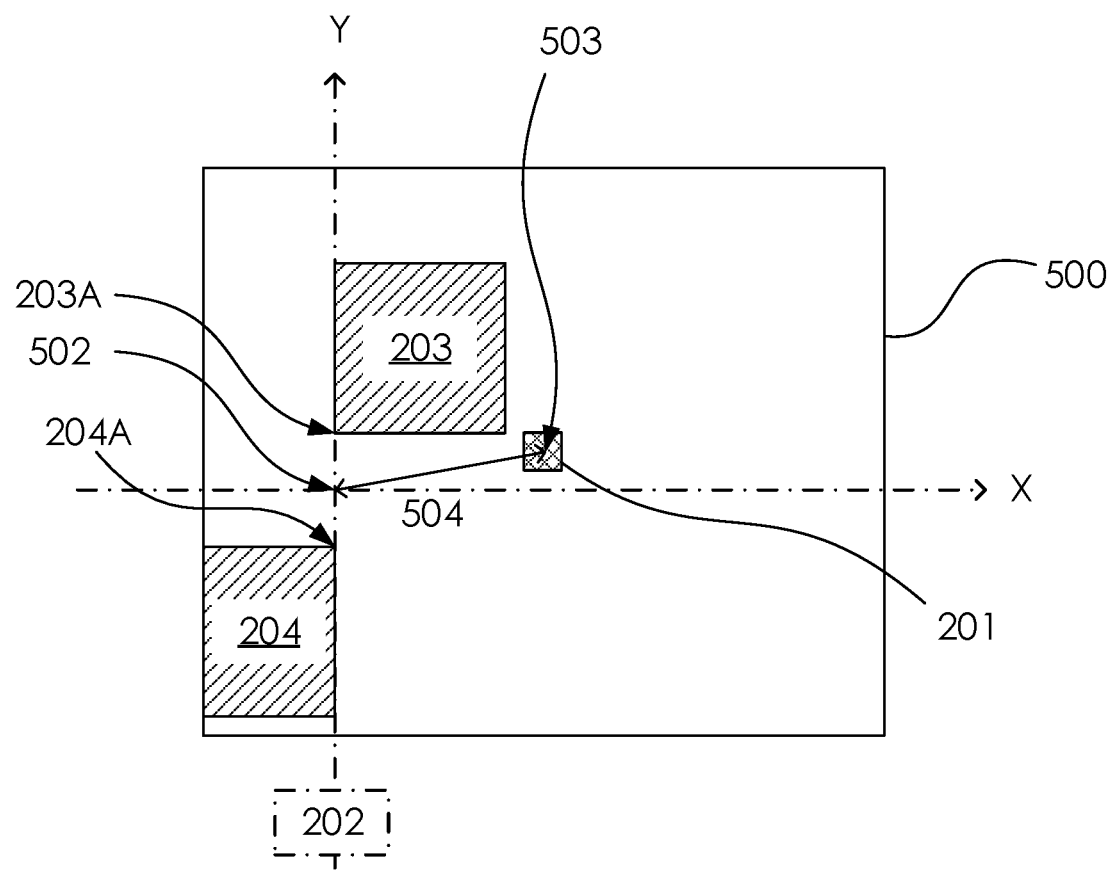
FIG. 8B illustrates a top view of a transformed inspection map according to some embodiments of the present disclosure.

The location coordinate of the programmed defect in the design map 200 may be pre-known but is not straight forward to be observed on the transformed inspection map. In some embodiments, by using the pair of care area markers as references, after transforming the design map 200 and the scanned map 300 into a transformed inspection map, in-situ mapping accuracy feedback can be referred to the pair of care area markers and the programmed defect nearby. Referring to FIG. 8A, FIG. 8A illustrates a top view of a transformed inspection map obtained from the design map of FIG. 7. The expected location 502 and the actual location 503 of the programmed defect 201 in the transformed inspection map 500 may be seen as overlapped, which means the registration between the scanned map and the design map is accurate based on previous swath. In contract, referring to FIG. 8B, which shows an example that the detected programmed defect is not overlapped with the expected programmed defect. There is an offset 504 between the expected location 502 and the actual location 503 of the programmed defect 201. Under such circumstance, the first care area marker 203 and the second care area marker 204 may be used to in-situ feedback the transformed outcome of the design map and the scanned map because the crossing point of the care area markers 203 and 204 indicates the expected location 502 of the programmed defect. In some embodiments, an image processing algorithm can be implemented to define the cross points of the care area markers 203 and 204, and thus identifying the expected location 502 of the programmed defect. Self-monitoring of the transforming accuracy may be conducted by comparing the location of the detected or scanned programmed defect 201 on the transformed inspection map 500 and locations of the pair of care area markers 203, 204 on the transformed inspection map 500.

For instance, after the actual location 503 of the programmed defect 201 are detected according to the transformed inspection map 500, the system, which will be described later, may use an image processing algorithm to find the corners 203A, 204A of the first care area marker 203 and the second care area marker 204 in the transformed inspection map 500 at the vicinity of the programmed defect 201. The center between the two opposing corners 203A, 204A is the expected location 502 of the programmed defect 201. Thus the offset between the actual location 503 and the expected location 502 of the programmed defect 201 and can be measured to determine the mapping accuracy. In addition, the mapping accuracy may be feedback and taken into consideration in the mapping calculation of the subsequent swath.

In some embodiments, the pair of care area markers 203, 204 may be replaced by a crosshair as a reference to indicate the expected location of the programmed defect on the transformed inspection map, as previously shown in FIG. 6.

Figure 9:
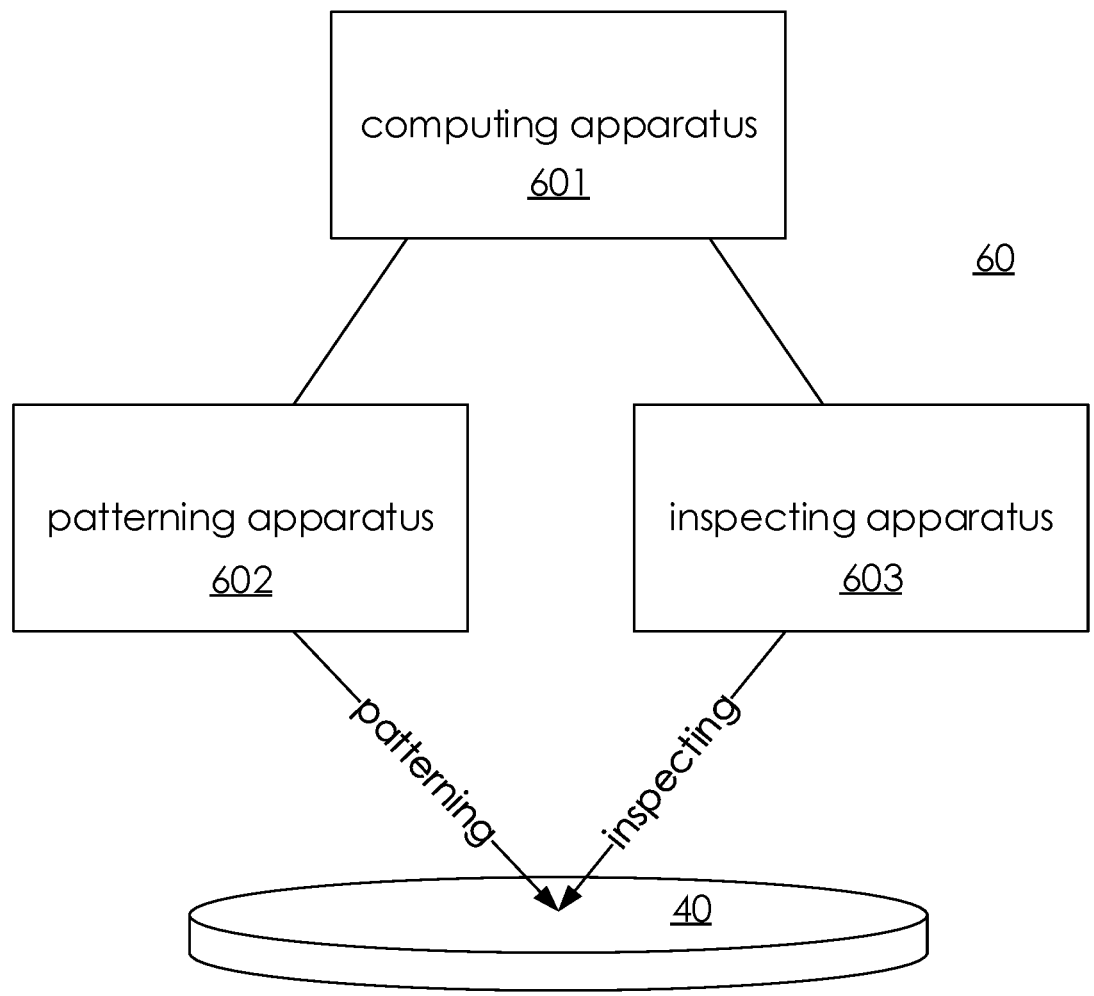
FIG. 9 illustrates system of semiconductor wafer inspection according to some embodiments of the present disclosure.

In order to perform the method for semiconductor wafer inspection as above mentioned, as shown in FIG. 9, in some embodiments, the system 60 for semiconductor wafer inspection of the present disclosure at least includes a computing apparatus 601, a patterning apparatus 602, and an inspecting apparatus 603. In some embodiments, both of the patterning apparatus 602 and the inspecting apparatus 603 are coupled to the computing apparatus 601.

In some embodiments, the computing apparatus 601 is configured to provide the design map 200 having a first programmed defect on the expected location as shown in previously shown FIG. 2B. In some embodiments, the computing apparatus 601 is further configured to generate the transformed inspection map 500 to ascertain the offset between the expected location and the actual location as shown in previously shown FIG. 8B.

In some embodiments, the patterning apparatus 602 is configured to form the first programmed defect on the semiconductor wafer 40 according to the design map. Generally, lithography techniques may be used to transfer the programmed defect pattern of the mask to the semiconductor wafer 40. The lithography techniques generally may include x-ray, ion, electron-beam or optical methods. These methods are known in the industry by various trade names of their tools. In some embodiments, the lithography techniques may utilize dry or wet processing.

In some embodiments, the inspecting apparatus 603 is configured to scan the semiconductor wafer 40 to acquire the scanned map. In some embodiments, the inspecting apparatus 603 may be optical devices such as optical, laser-based, electron-beam or other similar type of inspection tools. In some embodiments, the inspecting apparatus 602 may be a scanning electron microscope (SEM) is used to determine the size and locations of the programmed defects in a nanometer or micrometer scale. In some embodiments, after registering the scanned map and the design map, the hot spots of the semiconductor wafer can be inspected by the inspecting apparatus 603 by cursoring the inspection apparatus 603 to the pre-known locations of the hot spots.

In some embodiments, the inspecting apparatus 603 may include a light source. The light source may be any suitable light source known in the art such as a broadband plasma light source. In some embodiments, the inspecting apparatus 603 may further include a beam splitter and a refractive optical element (ROE), wherein light from the light source may be reflected to the refractive optical element by the beam splitter. Accordingly, the light from the light source may be directed to the semiconductor wafer at any suitable angle of incidence. In some embodiments, the inspecting apparatus 603 may further include some other suitable optical elements such as filters or polarizers. In addition, the light reflected from the semiconductor wafer 40 may be collected by the inspecting apparatus 603 through the aforementioned refractive optical element and the beam splitter. In some embodiments, the optical detector may be any suitable optical detector such as charge coupled device (CCD). The optical detector may provide the output regarding the scanned map as aforementioned. In some embodiments, the form of the output may include signals, signal data, images, image data, and any other suitable output.

Besides the first programmed defect, in some embodiments, the design map may further include a second programmed defect, and the second programmed defect is formed on the semiconductor wafer 40 by the patterning apparatus 602 and subsequently scanned by the inspecting apparatus 603. Moreover, as previously shown in FIG. 5, in some embodiments, the first programmed defect 401A and the second programmed defect 401B are within a scanning swath height $H_S$ of the inspecting apparatus 603. In other words, the first programmed defect 401A and the second programmed defect 401B are the two anchor points in determining the scaling constant and the shifting constant of the linear mapping function in some embodiments.

According to the present disclosure, the method for semiconductor wafer inspection by using programmed defects is disclosed. The programmed defects may be inserted to several strategic locations during the layout design of the die. Next, during the inspection process, the programmed defects may be detected in the scanned images and may be used as anchors to register the design layout to the scanned image. In addition, during the registration of the design layout and the scanned image with programmed defects, an in-situ mapping accuracy monitoring mechanism can be implemented by identifying an offset between the actual and the expected location of the programmed defects on the transformed inspection map. In some embodiments, by utilizing a pairs of care area markers in the transformed inspection map, in-situ feedback of mapping accuracy may be achieved in a more straight-forward and efficient manner.

In one exemplary aspect, a method for semiconductor wafer inspection is provided. The method includes the following operations. The semiconductor wafer is scanned to acquire a scanned map, wherein the semiconductor wafer is patterned according to a design map having a programmed defect. The design map and the scanned map are transformed to a transformed inspection map according to the location of the programmed defect on the design map and the location of the programmed defect on the scanned map.

In another exemplary aspect, a method for semiconductor wafer inspection is provided. The method includes the following operations. A programmed defect is formed on the semiconductor wafer according to an expected location on a design map. A semiconductor wafer is scanned to acquire a scanned map. An actual location of the programmed defect in the scanned map is detected. A transformed inspection map is obtained based on the design map and the scanned map to ascertain an offset between the expected location and the actual location.

In another exemplary aspect, a system for semiconductor wafer inspection is provided. The system includes a computing apparatus, a patterning apparatus, and an inspecting apparatus. The computing apparatus is configured to provide a design map having a first programmed defect on an expected location. The patterning apparatus is coupled to the computing apparatus and is configured to form the first programmed defect on an actual location of the semiconductor wafer according to the design map. The inspecting apparatus is coupled to the computing apparatus and configured to scan the semiconductor wafer to acquire a scanned map. The computing apparatus is further configured to generate a transformed inspection map to ascertain an offset between the expected location and the actual location.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for semiconductor wafer inspection, comprising:
    scanning the semiconductor wafer to acquire a scanned map, wherein the semiconductor wafer is patterned according to a design map having a programmed defect;
    transforming the design map and the scanned map to a transformed inspection map according to the location of the programmed defect on the design map and the location of the programmed defect on the scanned map; and
    self-monitoring the transforming accuracy by comparing a location of the programmed defect on the transformed inspection map and locations of a pair of care area markers on the transformed inspection map.

2. The method of claim 1, wherein the pair of care area markers are symmetrically located with respect to the programmed defect on the design map and indicating an expected location of the programmed defect.

3. The method of claim 2, wherein comparing the location of the programmed defect on the transformed inspection map and the locations of the pair of care area markers comprises obtaining an offset between the expected location of the programmed defect and the location of the programmed defect on the transformed inspection map.

4. The method of claim 3, further comprising updating the transformed inspection map according to the offset.

5. The method of claim 1, wherein scanning the semiconductor wafer comprises scanning through at least two programmed defects per swath height.

6. The method of claim 1, wherein the programmed defects are located at a boundary of a chip region on the design map.

7. The method of claim 1, wherein the programmed defects are located in repeating patterns of the design map.

8. A method for semiconductor wafer inspection, comprising:
    forming a plurality of programmed defects on a semiconductor wafer according to a plurality of expected locations on a design map;
    scanning the semiconductor wafer along a first swath to acquire a scanned map;
    detecting at least an actual location of at least one of the programmed defect in the scanned map;
    obtaining a transformed inspection map based on the design map and the scanned map to ascertain a first offset between the expected location and the actual location; and
    applying an adjusted mapping calculation in scanning the semiconductor wafer along a second swath to acquire another scanned map having a second offset less than the first offset.

9. The method of claim 8, wherein forming the programmed defect comprises:
    forming an opening at a mask layer; and
    patterning the semiconductor wafer by the mask layer.

10. The method of claim 8, wherein the design map comprises a first coordinate plane, and the scanned map comprises a second coordinate plane, the first coordinate plane and the second coordinate plane are correlated with a linear mapping function.

11. The method of claim 10, wherein the design map further comprises two care area markers located symmetrically with respect to the expected location of the programmed defect.

12. The method of claim 11, wherein the expected location of the programmed defect is between opposing corners of the two care area markers.

13. The method of claim 11, wherein the scanned map comprises at least two programmed defects per swath.

14. The method of claim 13, wherein obtaining the transformed inspection map comprises:
    solving the linear mapping function based on the expected location and the actual location of the programmed defect; and
    transforming the scanned map to the transformed inspection map according to the linear mapping function.

15. The method of claim 14, wherein transforming the scanned map to the transformed inspection map comprises:
    scaling and shifting the second coordinate plane.

16. A system for semiconductor wafer inspection, comprising:
    a computing apparatus configured to provide a design map having a first programmed defect on an expected location;
    a patterning apparatus coupled to the computing apparatus and configured to form the first programmed defect on an actual location of the semiconductor wafer according to the design map; and
    an inspecting apparatus coupled to the computing apparatus and configured to scan the semiconductor wafer to acquire a scanned map;
    wherein the computing apparatus is further configured to generate a transformed inspection map to ascertain an offset between the expected location and the actual location, and the transforming accuracy of the transformed inspection map is self-monitored by comparing a location of the programmed defect on the transformed inspection map and locations of a pair of care area markers on the transformed inspection map.

17. The system of claim 16, wherein the design map further comprises a second programmed defect, and the second programmed defect is formed on the semiconductor wafer by the patterning apparatus and scanned by the inspecting apparatus.

18. The system of claim 17, wherein the first programmed defect and the second programmed defect are within a scanning swath height of the inspecting apparatus.

19. The system of claim 16, wherein the inspecting apparatus further configured to detect a hot spot of the semiconductor wafer, wherein the actual location of the first programmed defect is not overlapped within the hot spot of the semiconductor wafer.

20. The method of claim 8, wherein the first swath is adjacent to the second swath.

\* \* \* \* \*